US006911856B2

(12) United States Patent
Florescu (10) Patent No.: US 6,911,856 B2
(45) Date of Patent: Jun. 28, 2005

(54) DELAY MATCHING FOR CLOCK DISTRIBUTION IN A LOGIC CIRCUIT (75) Inventor: Octavian Florescu, Kanata (CA)

(73) Assignee: Qualcomm Inc., San Diego, CA (US)

( * ) Notice: Subject to any disclaimer, the term of this patent is extended or adjusted under 35 U.S.C. 154(b) by 0 days.

(21) Appl. No.: 10/632,651

(22) Filed: Jul. 31, 2003

(65) Prior Publication Data

US 2005/0024116 A1 Feb. 3, 2005

(51) Int. Cl.$^7$ .............................................. H03K 3/00
(52) U.S. Cl. ...................................... 327/250; 327/251
(58) Field of Search ................................ 327/202, 217, 327/250, 251, 407, 408

(56) References Cited

U.S. PATENT DOCUMENTS

| 4,797,575 A | * | 1/1989 | Lofgren ........................ 327/202 |
| 5,376,848 A |   | 12/1994 | Hanke, III et al. ......... 327/141 |
| 5,774,080 A | * | 6/1998 | Morley ........................ 341/101 |
| 5,949,269 A |   | 9/1999 | Allen .......................... 327/285 |
| 6,236,693 B1 |  | 5/2001 | Haulin ........................ 375/354 |
| 6,477,592 B1 | * | 11/2002 | Chen et al. ................... 710/52 |

FOREIGN PATENT DOCUMENTS

JP          409046189 A  *  2/1997  ............ H03K/5/00

* cited by examiner

Primary Examiner—Linh My Nguyen
(74) Attorney, Agent, or Firm—Philip R. Wadsworth; Charles D. Brown; George C. Pappas

(57) ABSTRACT

Techniques for compensating for propagation delay differences between signals distributed within a logic circuit. A delay matching circuit mimics the internal clock-to-Q delay produced by a flop. The delay matching circuit is placed in the propagation path of an original signal, such as a clock signal, to be redistributed. In general, the delay matching circuit may include a propagation gate multiplexer have a particular configuration. The delay matching circuit imposes a delay substantially equal to the clock-to-Q delay experienced by divided versions of the original signal. In this manner, the delay matching circuit ensures that the rising and falling edges of the original signal and the divided signal are in substantial alignment, enabling synchronous operation. Hence, the delay matching circuit is capable of synchronizing the redistributed and divided signals.

7 Claims, 6 Drawing Sheets

DELAY MATCHING FOR CLOCK DISTRIBUTION IN A LOGIC CIRCUIT

TECHNICAL FIELD

The disclosure relates to compensation for differences in propagation delay among clock signals distributed within a logic circuit.

BACKGROUND

Many devices include synchronous clock dividers that serve to divide and redistribute a clock signal within a logic circuit. High speed telecommunication devices, for example, make use of different clock signals that are produced by dividing an original clock signal. In particular, clock divider circuits reduce the frequency of an original clock signal. Ideally, the clock signals should be redistributed synchronously throughout a logic circuit so that the rising and falling edges of the original clock signal and the divided clock signals are perfectly aligned with one another.

Unfortunately, the divided clock signals are typically delayed with respect to the original clock signal. In particular, the divided clock signals are launched from flip-flops using the original clock signal. The flip-flops produce an internal delay from the clock input to the Q output, i.e., a "clock-to-Q" delay. The clock-to-Q delay causes differences in propagation delay between the original clock signal and the divided clock signal. Propagation delay differences prevent proper synchronization of the divided clock signals and the redistributed clock signal, undermining proper operation of the logic circuit.

SUMMARY

This disclosure is directed to techniques for compensating propagation delay differences between clock signals distributed within a logic circuit. In accordance with the disclosure, a delay matching circuit mimics an internal clock-to-Q delay produced by a flip-flop. The delay matching circuit is placed in the propagation path of an original clock signal to be redistributed.

In general, the delay matching circuit may include a propagation gate multiplexer having a configuration selected to match current sinking and sourcing characteristics of a slave stage associated with the flip-flop. The delay matching circuit imposes a delay substantially equal to the clock-to-Q delay imposed upon divided versions of the original clock signal.

In this manner, the delay matching circuit ensures that the rising edges of the original signal and the divided signal are in substantial alignment, enabling synchronous operation. Hence, the delay matching circuit is capable of synchronizing the redistributed and divided signals very precisely.

The delay matching circuit may perform well over a range of processes, temperatures, voltages, frequencies and other operating conditions. In some embodiments, the delay matching circuit may further include an asynchronous reset feature to permit the circuit to match both synchronous delay characteristics and asynchronous operation of a flip-flop.

In one embodiment, the disclosure provides a clock distribution circuit. The clock distribution circuit comprises a clock source to generate a clock signal, and a clock divider to divide the clock signal and produce a divided clock signal. The clock divider includes a flip-flop that introduces a first propagation delay to the divided clock signal. A delay matching circuit to distribute the clock signal introduces a second propagation delay to the clock signal. The second propagation delay substantially matches the first propagation delay introduced in the divided clock signal by the flip-flop.

In another embodiment, the disclosure provides a delay matching circuit. The delay matching circuit comprises a multiplexer coupled to a clock source, transmission gates within the multiplexer to substantially mimic characteristics of slave transmission gates in a flip-flop, inputs coupled to the multiplexer to substantially mimic characteristics of a master output driver of the flip-flop, and an output coupled to the multiplexer to substantially mimic characteristics an output driver in the flip-flop.

In an added embodiment, the disclosure provides a delay matching circuit comprising a multiplexer having a first input coupled to drive a first transmission gate, a second input coupled to drive a second transmission gate, a select input coupled to a, clock source to selectively enable one of the transmission gates, and an output coupled to the first and second transmission gates. The transmission gates are configured to correspond substantially to a slave transmission gate in a flip-flop. A PMOS transistor has a drain coupled to the first input, a gate coupled to ground, and a source coupled to a supply voltage. The PMOS transistor is configured to correspond substantially to a PMOS transistor in a master output driver of the flip-flop. An NMOS transistor has a drain coupled to the second input, a gate coupled to the supply voltage, and a source coupled to ground. The NMOS transistor is configured to correspond substantially to an NMOS transistor in the master output driver of the flip-flop. An inverter, coupled to the output of the multiplexer, is configured to correspond substantially to an output driver in the flip flop.

In a further embodiment, the disclosure provides a circuit comprising a signal source to generate a signal, a signal distribution circuit to modify the signal and distribute a modified signal, wherein the signal distribution circuit includes a flip-flop that introduces a first propagation delay in the modified signal, and a delay matching circuit to distribute the signal, wherein the delay matching circuit introduces a second propagation delay to the signal, the second propagation delay substantially matching the first propagation delay introduced in the modified signal by the flip-flop.

In another embodiment, the disclosure provides a method comprising dividing a clock signal with a flip-flop to produce a divided clock signal, wherein the flip-flop introduces a first propagation delay to the divided clock signal, and introducing a second propagation delay to the clock signal with a delay matching circuit. The second propagation delay substantially matches the first propagation delay introduced in the divided clock signal by the flip-flop. The delay matching circuit substantially mimics delay characteristics of the flip-flop.

The details of one or more embodiments are set forth in the accompanying drawings and the description below. Other features, objects, and advantages will be apparent from the description and drawings, and from the claims.

DETAILED DESCRIPTION

Figure 1:
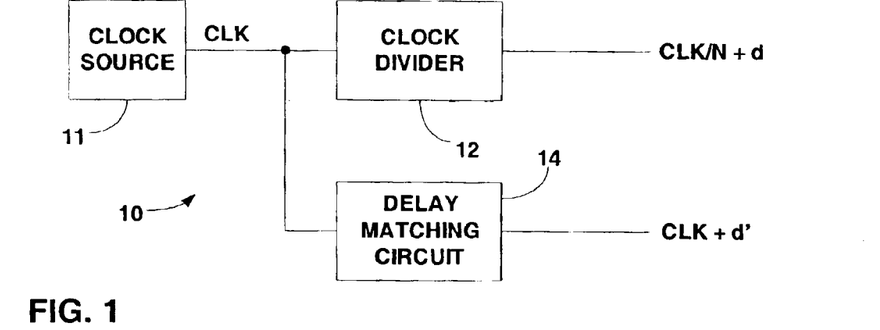
FIG. 1 is a block diagram illustrating a signal distribution circuit.

FIG. 1 is a block diagram illustrating a signal distribution circuit 10. In the example of FIG. 1, circuit 10 receives a clock signal CLK from a clock source 11, and distributes the clock signal and divided versions of the clock signal within a logic circuit. The clock signal CLK may be, for example, a system clock or the output of a voltage controlled oscillator (VCO) in a phase-locked loop (PLL).

A clock divider 12 divides the CLK signal into a lower frequency clock signal. CLK/N and introduces a propagation delay d, e.g., a clock-to-Q delay. The resultant divided clock signal is CLK/N+d. As will be described, clock divider circuit 12 may include a flip-flop that introduces a clock-to-Q delay in the divided clock signal CLK/N+d.

A delay matching circuit 14 resides within a redistribution path for the original clock signal CLK. The original clock signal CLK is redistributed across a larger logic circuit, along with the divided clock signal CLK/N+d. The clock-to-Q delay introduced by clock divider 12 causes propagation delay differences between the divided clock signal CLK/N+d and the original clock signal CLK. As a result, there may be a loss of synchronization between the divided clock signal CLK/N+d and the original, redistributed clock signal CLK.

Delay matching circuit 14 compensates the original clock signal CLK for the clock-to-Q delay introduced into the divided clock signal CLK/N+d. In particular, delay matching circuit 14 introduces a propagation delay d' to the clock signal CLK. The propagation delay d' substantially matches the propagation delay d introduced in the divided clock signal CLK/N+d by the flip-flop.

The resultant redistributed clock signal is CLK+d', which introduces a delay to substantially match the divided clock signal CLK/N+d, and thereby ensures proper synchronization. In some embodiments, delay matching circuit 14 also may be configured to not only match the synchronous clock-to-Q delay of clock divider 12, but also provide an asynchronous reset feature.

Figure 2:
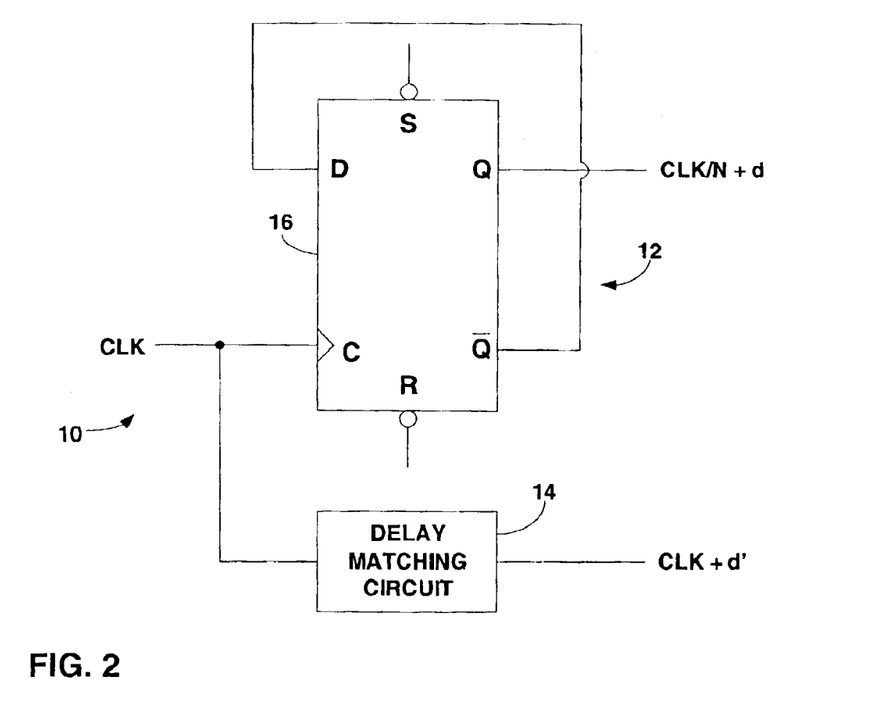
FIG. 2 is a block diagram illustrating the circuit of FIG. 1 in greater detail.

FIG. 2 is a block diagram illustrating circuit 10 of FIG. 1 in greater detail. In particular, FIG. 2 depicts clock distribution circuit 10 and clock divider 12 in conjunction with a D flip-flop 16 having a data input (D), a clock input (C), a data output (Q) and an inverted data output ($\overline{Q}$).

In FIG. 2, for purposes of illustration, the inverted data output ($\overline{Q}$) is coupled to the data input to produce a divide-by-2 clock divider. However, clock divider 12 may take the form of any divide-by-N circuit, and may divide the original clock signal CLK by factors of 2, 4, 6, and so forth, to produce a clock signal with any frequency that originates from a flip-flop. As will be described, delay matching circuit 14 is configured to mimic the delay characteristics of flip-flop 16. In particular, delay matching circuit 14 includes circuit components designed to mimic components within flip-flop 16.

Figure 3:
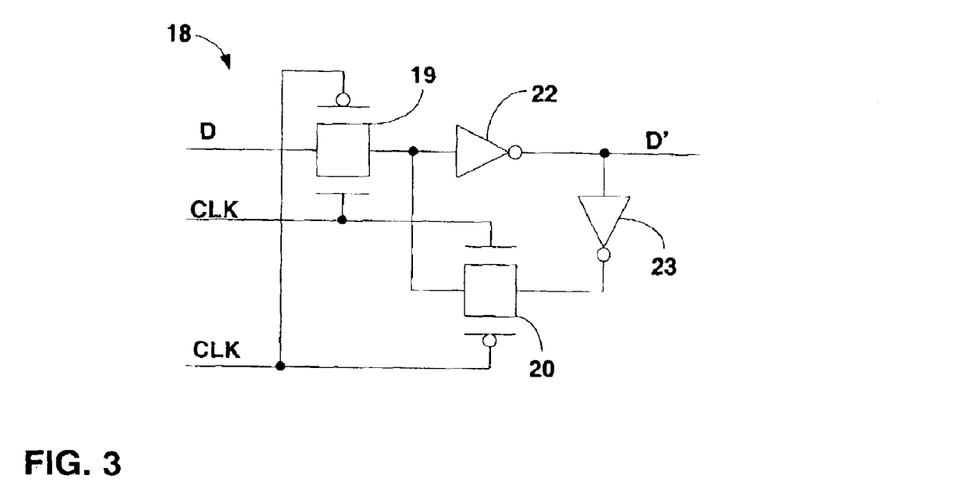
FIG. 3 is a circuit diagram illustrating a master driver stage of a flip-flop.

FIG. 3 is a circuit diagram illustrating a master driver stage 18 of a flip-flop 16. As shown in FIG. 3, master driver stage 18 includes a first master transmission gate 19, a second master transmission gate 20, an output inverter 22 and a feedback inverter 23. The data input (D) of flip-flop 16 drives first master transmission gate 19 with an input data signal, e.g., an original clock signal.

The outputs of first and second master transmission gates 19, 20 are coupled together to drive output inverter 22. Each transmission gate 19, 20 receives clock (CLK) and inverted clock ($\overline{CLK}$) signals. Output inverter 22 produces an output data signal D', which is transmitted to a slave stage of flip-flop 16. Feedback inverter 23, coupled to the output of output inverter 22, drives the input of second master transmission gate 20.

Figure 4:
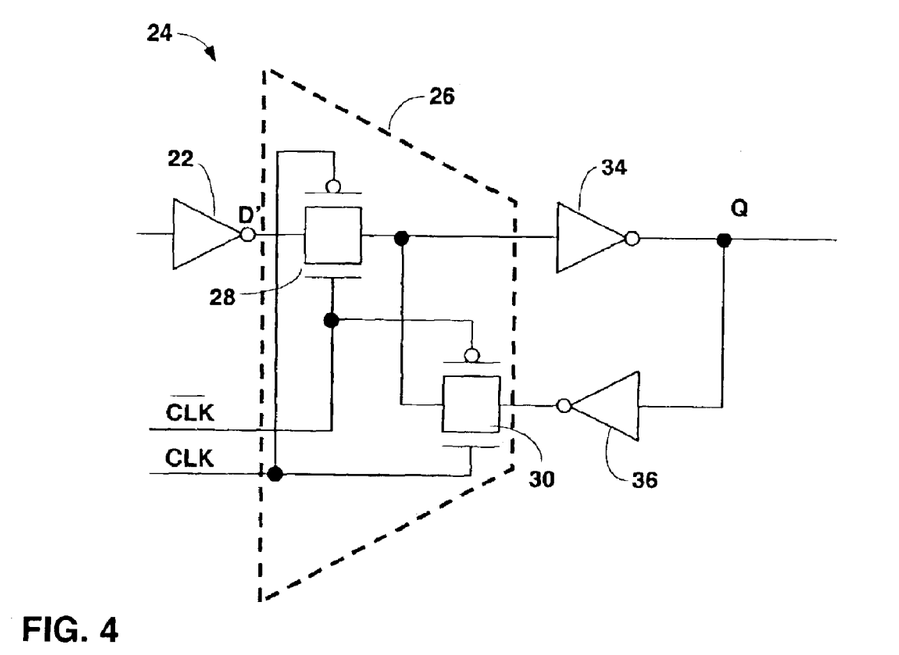
FIG. 4 is a circuit diagram illustrating a slave stage of a flip-flop.

FIG. 4 is a circuit diagram illustrating a slave stage 24 of flip-flop 16. As shown in FIG. 4, slave stage 24 includes, in effect, a multiplexer section 26, which incorporates a first slave transmission gate 28 and a second slave transmission gate 30. Output inverter 22 of master driver stage 18 drives first slave transmission gate 28 with the data output D'. Each slave transmission gate 28, 30 in slave stage 24 receives clock (CLK) and inverted clock ($\underline{CLK}$) signals. First slave transmission gate 28 drives output inverter 34, which produces a data output signal (Q). A feedback inverter 36 drives second slave transmission gate 30.

Slave transmission gates 28, 30 are characterized by intrinsic current sinking and sourcing capabilities that result in the introduction of a delay d to divided clock signals launched from flip-flop 16. The resulting delay creates a difference in the timing of the original clock signal and the divided clock signal. This difference undermines synchronization of the divided clock signal and the redistributed original clock signal, and requires compensation.

Ideally, the original clock signal should be redistributed synchronously so that the rising and falling edges of the original clock signal and the divided clock signals are perfectly aligned. In addition, it is generally desirable to maintain the timing of the original clock signal and the divided clock signal over a range of processes, temperatures, voltages, frequencies and other operating conditions.

Figure 5:
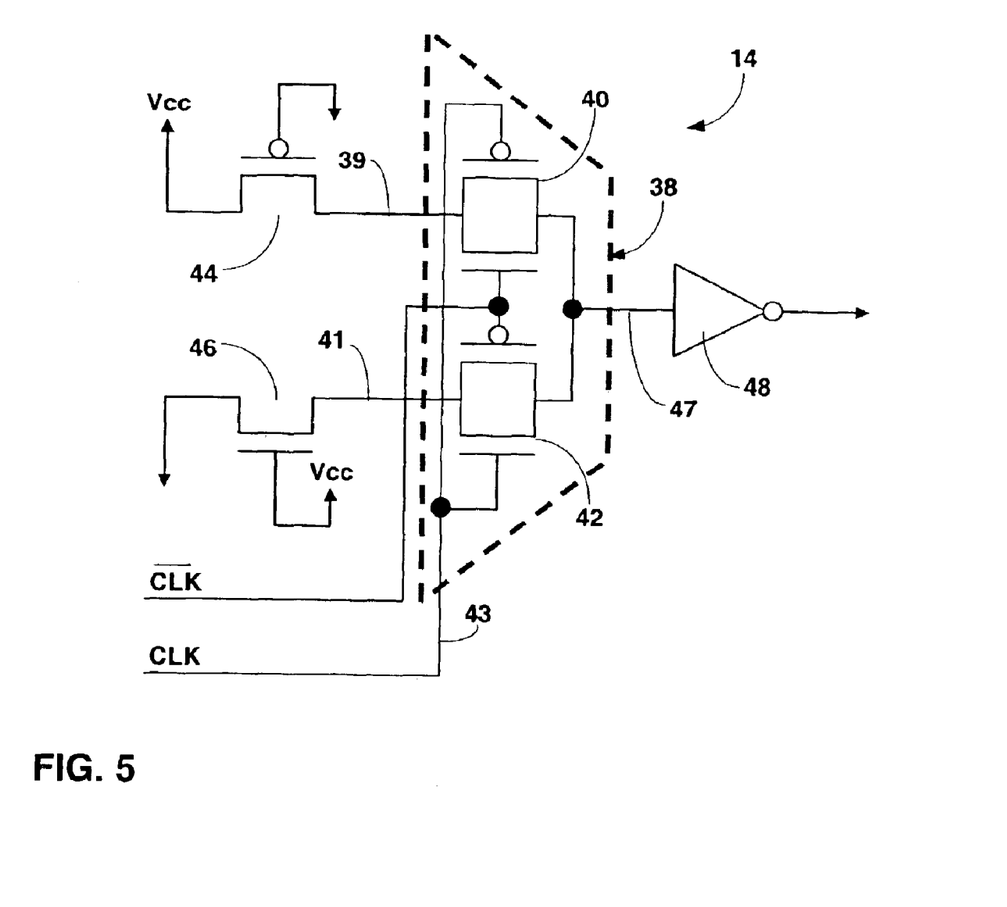
FIG. 5 is a circuit diagram illustrating a delay matching circuit for use in the distribution circuit of FIGS. 1 and 2.

FIG. 5 is a circuit diagram illustrating a delay matching circuit 14 for use in the distribution circuit 10 of FIGS. 1 and 2. In general, delay matching circuit 14 mimics the functionality and timing of slave stage 24 of FIG. 4. If transistors within delay matching circuit 14 are matched with corresponding transistors in slave stage 24, in terms of materials, size, and other characteristics, the timing of delay matching circuit 14 will parallel that of flip-flop 16. In addition, because similar materials and sizes are used, the performance of delay matching circuit 14 will be generally unaffected by changes in processes, temperatures, voltages, frequencies and other operating or manufacturing conditions.

As shown in FIG. 5, delay matching circuit 14 includes a multiplexer 38. Multiplexer 38 includes a first input 39 coupled to drive a first transmission gate 40, and a second input 41 coupled to drive a second transmission gate 42. Multiplexer 38 includes a select input 43 that is coupled to the clock source to selectively enable one of the transmission gates 40, 42 with an inverted clock signal ($\overline{CLK}$). The inverted clock signal ($\overline{CLK}$) is coupled in common to both transmission gates 40, 42. Multiplexer 38 has an output coupled to outputs of first and second transmission gates 40, 42.

Transmission gates 40, 42 are configured to correspond substantially to slave transmission gate 28. In particular, transmission gates 40, 42 are matched to slave transmission gate 28 of flip-flop 16 in terms of current sourcing and sinking capabilities. New data is launched at the rising edge of the clock signal CLK through slave transmission gate 28 in flip-flop 16. As will be described, input transistors 44, 46 are matched to inverter 22.

The data path through flip-flop 16 includes inverter 22, transmission gate 28, and inverter 34. The current sinking and sourcing power of this data path is replicated twice within delay matching circuit 14 of FIG. 5, once for first input 39 and once for second input 41. During a rising edge of the clock signal CLK, transmission gate 28 of flip-flop 16 opens and transmission gate 30 closes, which is analogous to the operation of multiplexer 38 at every clock transition. Transmission gate 30 in flip-flop 16 is typically much smaller than transmission gate 28. Consequently, each transmission gate 40, 42 is matched to the characteristics of transmission gate 28 in flip-flop 16 in terms of current sourcing and sinking capabilities.

With further reference to FIG. 5, a PMOS transistor 44 has a drain coupled to first input 39 of multiplexer 38, a gate coupled to ground, and a source coupled to a supply voltage Vcc. PMOS transistor 44 is configured to correspond substantially to a PMOS transistor in a master output driver, e.g., output inverter 22, in master stage 18 of flip-flop 16. In particular, PMOS transistor 44 offers substantially the same current sinking and current sourcing ability as the corresponding PMOS transistor in the flip-flop.

An NMOS transistor 46 has a drain coupled to second input 41 of multiplexer 38, a gate coupled to the supply voltage Vcc, and a source coupled to ground. NMOS transistor 46 is configured to correspond substantially to an NMOS transistor in a master output driver, e.g., output inverter 22, in master stage 18 of flip-flop 16. In particular, NMOS transistor 46 offers substantially the same current sinking and current sourcing ability as the corresponding NMOS transistor in the flip-flop.

An inverter 48 is coupled to the output 47 of multiplexer 38, and is configured to correspond substantially to an output driver of flip flop 16, e.g., output inverter 34. In particular, output inverter 48 is selected to provide substantially the same output current drive ability as output inverter 34 of the flip-flop.

In general, delay matching circuit 14 is designed to mimic the behavior and, particularly, the clock-to-Q propagation delay characteristics of the flip-flop 16 used to launch the divided clock signal CLK/N+d. Delay matching circuit 14 "mimics" the behavior of flip-flop 16 in the sense that it includes a number of components designed to substantially mimic characteristics of corresponding components in flip-flop 16. For example, as mentioned above, transmission gates 40, 42 are substantially matched to slave transmission gate 28. Transmission gates 40, 42 substantially mimic characteristics of slave transmission gates 28 in flip-flop 16. In particular, transmission gates 40, 42 are selected to switch as quickly as slave transmission gate 28, and to impede the sinking and sourcing of current in a manner similar to the slave transmission gate 28.

In addition, transistors 44, 46 are substantially matched to inverter 22 of flip-flop 16, and output inverter 48 is substantially matched to output inverter 34 of the flip-flop. The data path through flip-flop 16 generally includes inverter 22, transmission gate 28 and inverter 34. Again, the current sinking and sourcing characteristic of this, data path is replicated twice in the exemplary delay matching circuit 14 of FIG. 5, once for the first input of multiplexer 38 and once for the second input of multiplexer 38. Thus, an analogy can be made between multiplexer 38 of delay matching circuit 14, and multiplexer 26 of flip-flop 16. In particular, during a rising edge of clock signal CLK, transmission gate 28 opens and transmission gate 30 closes, which is analogous to the dynamics within multiplexer 38 at every clock transition.

Similarly, input transistors 44, 46 form multiplexer inputs that substantially mimic characteristics of master output driver stage 18 of flip-flop 16. In addition, inverter 48 forms a multiplexer output that substantially mimics characteristics of an output driver, such as inverter 34, in flip flop 16. Hence, delay matching circuit 14 substantially mimics current sinking and current sourcing characteristics of the flip-flop 16, and output drive characteristics of the flip-flop.

To effectively mimic corresponding components in flip-flop 16, components within delay matching circuit 14 are selected and sized appropriately. For example, transmission gates 40, 42 may be substantially identical in materials and size to transmission gate 28 of slave stage 24 of flip-flop 16. In terms of size, transmission gates 40, 42 may have electrode areas and gate width to gate length ratios that match those of transmission gates 28, 30.

Input transistors 44, 46 in delay matching circuit 14 may be formed from selected materials and sized so as to replicate drive transistors within master driver stage 18. Similarly, output inverter 48 may replicate the materials and size of corresponding output driver circuitry in flip flop 16. The similar sizes and materials selected for the various components of delay matching circuit 14 serve to approximate the current sinking and source capabilities, and hence the propagation delay characteristics, of flip-flop 16.

In the example of FIG. 5, delay matching circuit 14 is designed to mimic the delay characteristics of a divide-by-2 clock divider circuit, but provides divide-by-1 functionality to preserve the frequency of the original clock signal for redistribution. The circuitry of delay matching circuit 14 may be scaled up to match the delays produced by divide-by-4, divide-by-6, divide-by-8, or other divider ratios, as long as the output of clock divider 12 is launched synchronously by a flop in response to input clock signal CLK.

For example, to the extent clock divider circuitry incorporates additional flip-flops to implement additional factors of division, delay matching circuit 14 may incorporate additional mimic stages similar to those shown in FIG. 5, e.g., for a clock distribution scheme that makes use of cascading dividers in which one previously divided clock with one clock-to-Q delay is used to generate other divided clocks with additional clock-to-Q delays from CLK. In such a case, additional mimic stages can be provided in series.

In other non-cascaded cases, however, the number of flip-flops in a clock divider does not determine the output delay versus the original clock signal CLK. The CLK-to-output of clock divider 12 is determined by the flip-flop that drives the output. If that flip-flop is being fed the clock signal CLK, then, the output will be CLK/N+d. If the clock feeding the output flop is CLK+d", then the output will be CLK/N+d+d". As long as d" is an integer factor of d, delay mimic stages can be cascaded to make all of the outputs synchronous.

Figure 6:
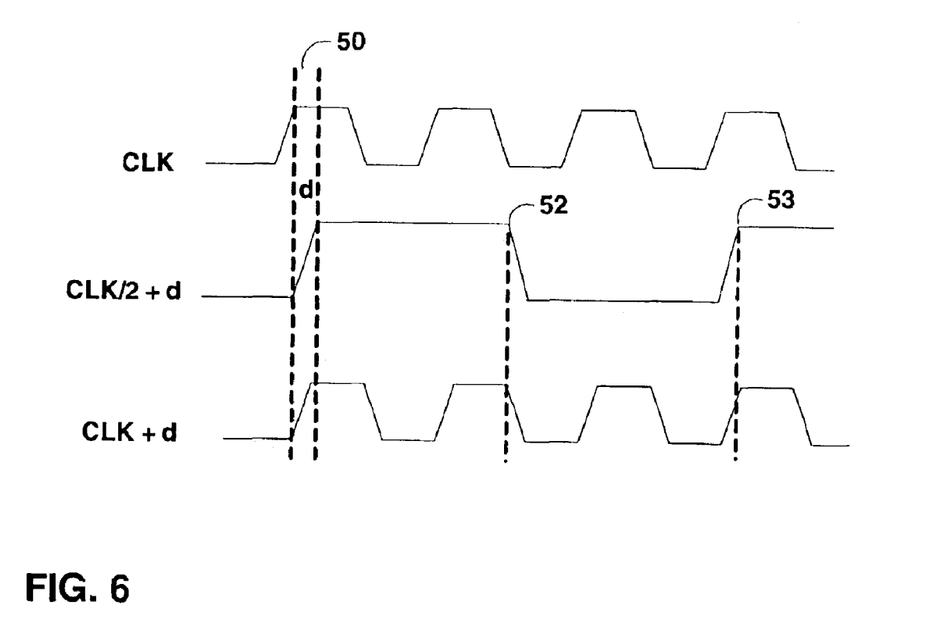
FIG. 6 is a timing diagram illustrating propagation delay differences among clock and divided clock signals, and delay-matched clock signals.

FIG. 6 is a timing diagram illustrating propagation delay differences among original clock, divided clock, and delay matched clock signals. As shown in FIG. 6, a delay d (50) exists between the original clock signal CLK and the divided clock signal CLK/2+d. This delay results from the clock-to-Q delay within flip-flop 16, and impairs the ability to synchronize the divided clock signal with the redistributed clock signal.

Delay matching circuit 14 compensates the original clock signal for redistribution, however, by adding the delay d. As a result, the redistributed clock signal CLK+d is synchronized with divided clock signal CLK/2+d. In particular, the falling edges 52 and rising edges 53 of the divided clock signal and the redistributed clock signal are substantially aligned with one another, permitting proper synchronization.

Figure 7:
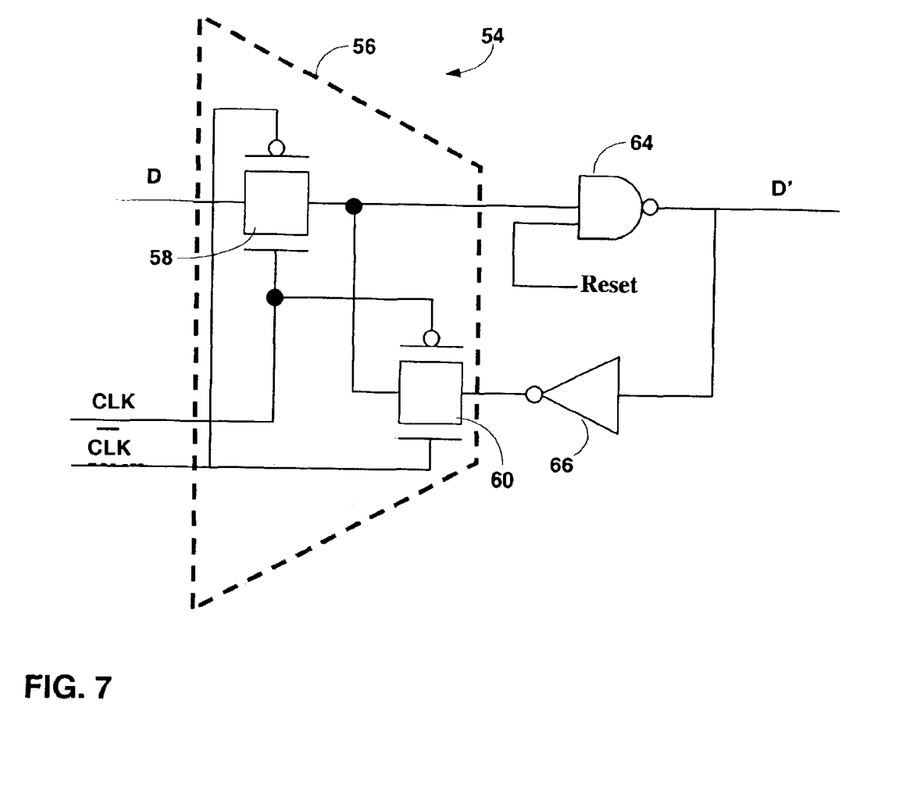
FIG. 7 is a circuit diagram illustrating a master driver stage of a flip-flop with asynchronous reset capabilities.

FIG. 7 is a circuit diagram illustrating a master driver stage 54 of a flip-flop with asynchronous reset capabilities. In the example of FIG. 7, the flip-flop may generally conform to flip-flop 16 depicted in FIGS. 2–5. For example, a multiplexer section 56 includes a first transmission gate 58 and a second transmission gate 60.

Each transmission gate 58, 60 receives clock (CLK) and inverted clock ($\overline{CLK}$) signals. Data input D drives first transmission gate 58. An output NAND gate 64 drives an intermediate data output D'. Feedback inverter 66 is coupled between intermediate data output D' and second transmission gate 60 to drive the second transmission gate.

The outputs of first and second master transmission gates 58, 60 are coupled together to drive output NAND gate 64. Output NAND gate 64 produces an intermediate data output D', which is transmitted to a slave stage of flip-flop 16. Notably, output NAND gate 64 has one input coupled to the outputs of transmission gates 58, 60, and another input coupled to an asynchronous reset line. When the reset line is asserted, intermediate data output D' is reset.

Hence, in addition to the synchronous clock-to-Q delay produced by the flip-flop, NAND gate 64 introduces an asynchronous timing consideration that can alter the synchronization between a divided clock signal and a redistributed clock signal. In particular, multiplexer 56, in combination with NAND gate 64 and the reset line, form an active low latch for asynchronous operation.

Figure 8:
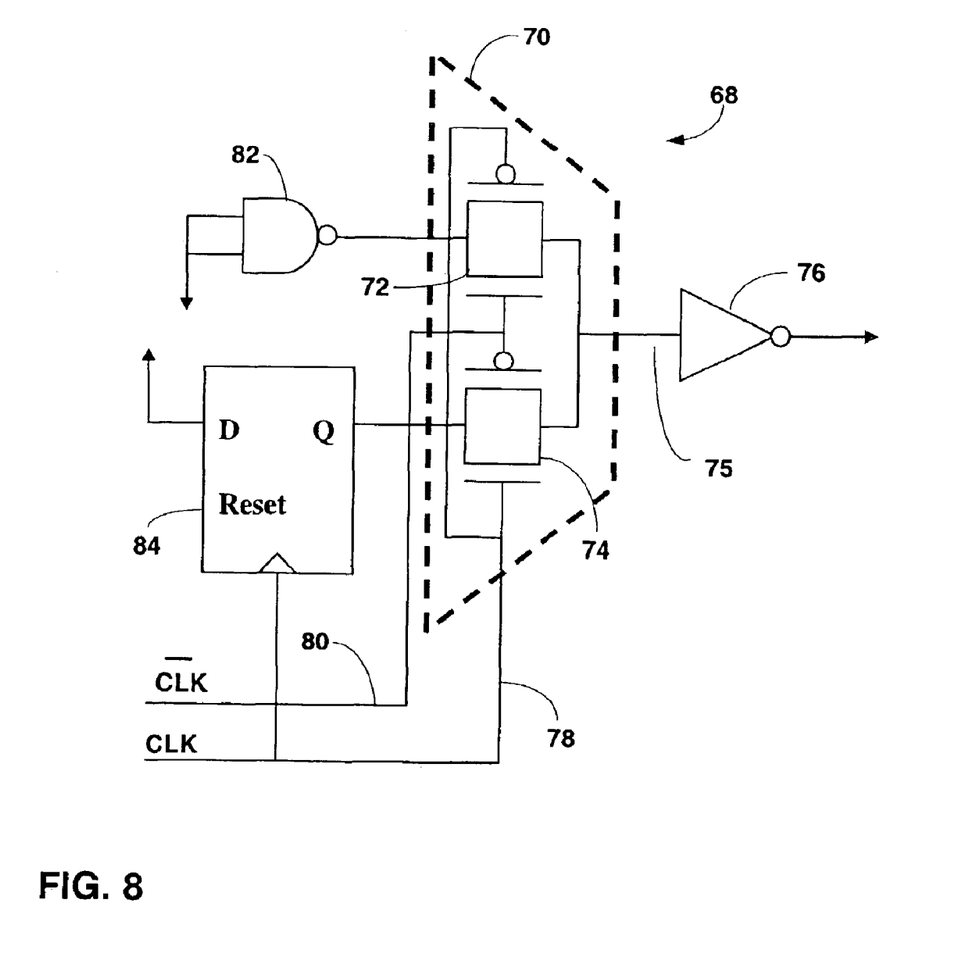
FIG. 8 is a circuit diagram illustrating a delay matching circuit with asynchronous reset capabilities.

FIG. 8 is a circuit diagram illustrating a delay matching circuit 68 with asynchronous reset capabilities. Delay matching circuit 68 mimics the timing of a flip-flop with an asynchronous reset, as illustrated in FIG. 7. In addition to matching the synchronous clock-to-Q delay, delay matching circuit 68 also mimics the asynchronous reset functionality of the flip-flop. In particular, when the reset line of the flip-flop is asserted, the output of delay matching circuit 68 is also driven to the reset value. Once the reset is deasserted, the output of delay matching circuit 68 remains at the reset value until a rising clock edge transition forces the output to change.

As shown in FIG. 8, delay matching circuit 68 includes a multiplexer section 70 incorporating a first transmission gate 72 and a second transmission gate 74. Multiplexer 68 has an output 75 coupled to outputs of first and second transmission gates 72, 74. The output 75 of transmission gates 70, 72 drives an output inverter 76 to produce the redistributed clock signal. Multiplexer 70 includes a select input 78 that is coupled to the clock source to selectively enable one of the transmission gates 72, 74. The inverse clock signal (CLK) is coupled in common to both transmission gates 72, 74 via an input 80.

An input NAND gate 82 drives transmission gate 72. An active low latch 84 is coupled to drive transmission gate 74. Active low latch 84 is substantially identical to master driver 54 of FIG. 7. NAND gate 82 is incorporated in the input to first transmission gate 72 to provide the correct drive because the output driver of the master latch is a NAND gate 64. NAND gate 82 is tied low so that the output is always high. Only the active low latch 84 needs to be reset, since the output is usually 0 and needs to be driven to 1 when the reset is asserted. In effect, NAND gate 82 is used to match the latch used in the flip-flop. Consequently, delay matching circuit 68 produces substantially the same delay and timing as a flip-flop that resets to a 0 state.

Example hardware implementations for the functional components described herein may include integrated and discrete logic circuitry that make use of flip-flops for clock divisions and clock redistribution. Delay matching circuitry as described herein may be useful in a variety of devices, including high speed logic circuitry, telecommunication devices, wireless telecommunication devices, and other circuitry requiring precise clock synchronization.

Various embodiments have been described. Numerous other modifications may be made without departing from the spirit and scope of this disclosure. For example, although synchronous and asynchronous reset topologies have been described in this disclosure for purposes of illustration, the principles disclosed herein may be readily applicable to other logic circuit topologies such as asynchronous set, enable, and synchronous set/reset. Accordingly, these and other embodiments are within the scope of the following claims.

What is claimed is:

1. A clock distribution circuit comprising:
    a clock source to generate a clock signal;
    a clock divider to divide the clock signal and produce a divided clock signal, and including a flip-flop that introduces a first propagation delay to the divided clock signal; and
    a delay matching circuit to distribute the clock signal, and to introduce a second propagation delay to the clock signal, the second propagation delay substantially matching the first propagation delay introduced in the divided clock signal by the flip-flop, wherein the delay matching circuit includes:
    a multiplexer having a first input coupled to drive a first transmission gate, a second input coupled to drive a second transmission gate, a select input coupled to the clock source to selectively enable one of the transmission gates, and an output coupled to the first and second transmission gates, wherein the transmission gates are configured to correspond substantially to a slave transmission gate in the flip-flop;
    a PMOS transistor having a drain coupled to the first input, a gate coupled to ground, and a source coupled to a supply voltage, wherein the PMOS transistor is configured to correspond substantially to a PMOS transistor in a master output driver of the flip-flop; and
    an NMOS transistor having a drain coupled to the second input, a gate coupled to the supply voltage, and a source coupled to ground, wherein the NMOS transistor is configured to correspond substantially to an NMOS transistor in the master output driver of the flip-flop.

2. The circuit of claim 1, wherein the PMOS transistor is configured to correspond substantially in size to the PMOS transistor in the master output driver of the flip-flop, and the NMOS transistor is configured to correspond substantially in size to the NMOS transistor in the master output driver of the flip-flop.

3. A delay matching circuit comprising:
    multiplexer coupled to a clock source;
    transmission gates within the multiplexer to substantially mimic characteristics of a slave transmission gate in a flip-flop;
    inputs coupled to the multiplexer to substantially mimic characteristics of a master output driver of the flip-flop;

an output coupled to the multiplexer to substantially mimic characteristics of an output driver in the flip flop; and a PMOS transistor having a drain coupled to a first one of the inputs, a gate coupled to ground, and a source coupled to a supply voltage, wherein the PMOS transistor is configured to correspond substantially to a PMOS transistor in a master output driver of the flip-flop; and an NMOS transistor having a drain coupled to a second one of the inputs, gate coupled to the supply voltage, and a source coupled to ground, wherein the NMOS transistor is configured to correspond substantially to an NMOS transistor in the master output driver of the flip-flop.

4. A delay matching circuit comprising:

a multiplexer having a first input coupled to drive a first transmission gate, a second input coupled to drive a second transmission gate, a select input coupled to a clock source to selectively enable one of the transmission gates, and an output coupled to the first and second transmission gates, wherein the transmission gates are configured to correspond substantially to a slave transmission gate in a flip-flop;

a PMOS transistor having a drain coupled to the first input, a gate coupled to ground, and a source coupled to a supply voltage, wherein the PMOS transistor is configured to correspond substantially to a PMOS transistor in a master output driver of the flip-flop;

an NMOS transistor having a drain coupled to the second input, a gate coupled to the supply voltage, and a source coupled to ground, wherein the NMOS transistor is configured to correspond substantially to an NMOS transistor in the master output driver of the flip-flop; and an inverter coupled to the output of the multiplexer, wherein the inverter is configured to correspond substantially to an output driver in the flip flop.

5. A circuit comprising:

a signal source to generate a signal;

a signal distribution circuit to modify the signal and distribute a modified signal, and including a flip-flop that introduces a first propagation delay in the modified signal; and a delay matching circuit to distribute the signal, and introduce a second propagation delay to the signal, the second propagation delay substantially matching the first propagation delay introduced in the modified signal by the flip-flop, wherein the delay watching circuit includes a multiplexer having a first input coupled to drive a first transmission gate, a second input coupled to drive a second transmission gate, a select input coupled to the signal source to selectively enable one of the transmission gates, and an output coupled to the first and second transmission gates, wherein the transmission gates are configured to correspond substantially to a slave transmission gate in the flip-flop, wherein the delay marching circuit further includes:

a PMOS transistor having a drain coupled to the first input, a gate coupled to ground, and a source coupled to a supply voltage, wherein the PMOS transistor is configured to correspond substantially to a PMOS transistor in a master output driver of the flip-flop; and an NMOS transistor having a drain coupled to the second input, a gate coupled to the supply voltage, and a source coupled to ground, wherein the NMOS transistor is configured to correspond substantially to an NMOS transistor in the master output driver of the flip-flop.

6. The circuit of claim 5, wherein the PMOS transistor is configured to correspond substantially in size to the PMOS transistor in the master output driver of the flip-flop, and the NMOS transistor to configured to correspond substantially in size to the NMOS transistor in the master output driver of the flip-flop.

7. A method comprising:

dividing a clock signal with a flip-flop to produce a divided clock signal, and to introduce a propagation delay to the divided clock signal; and introducing a second propagation delay to the clock signal with a delay marching circuit, the second propagation delay substantially marching the first propagation delay introduced in the divided clock signal by the flip-flop, wherein the delay matching circuit substantially mimics delay characteristics of the flip-flop, wherein the delay matching circuit includes a multiplexer having a first input coupled to drive a first transmission gate, a second input coupled to drive a second transmission gate, a select input coupled to the clock source to selectively enable one of the transmission gates, and an output coupled to the first and second transmission gates, and wherein the transmission gates are configured to correspond substantially to slave transmission gates in the flip-flop, wherein the delay matching circuit includes;

a PMOS transistor having a drain coupled to the first input, a gate coupled to ground, and a source coupled to a supply voltage, wherein the PMOS transistor is configured to correspond substantially to a PMOS transistor in a master output driver of the flip-flop; and an NMOS transistor having a drain coupled to the second input, a gate coupled to the supply voltage, and a source coupled to ground, wherein the NMOS transistor is configured to correspond substantially to an NMOS transistor in the master output driver of the flip-flop.

* * * * *